(12) United States Patent
Chang

(10) Patent No.: US 7,075,136 B2
(45) Date of Patent: Jul. 11, 2006

(54) SYSTEM-ON-CHIP INCLUDING DRAM AND ANALOG DEVICE FOR IMPROVING DRAM CAPACITANCE AND METHOD FOR FABRICATING THE SAME

(75) Inventor: Dong-Ryul Chang, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/922,439

(22) Filed: Aug. 19, 2004

(65) Prior Publication Data
US 2005/0048719 A1   Mar. 3, 2005

(30) Foreign Application Priority Data
Sep. 1, 2003   (KR) .................... 10-2003-0060766

(51) Int. Cl.
H01L 27/108 (2006.01)
H01L 29/76 (2006.01)
H01L 29/94 (2006.01)
H01L 31/119 (2006.01)

(52) U.S. Cl. ..................... 257/296; 257/758
(58) Field of Classification Search ........... 257/296, 257/68, 777, 758, 750, 759, 760, 761, 762, 257/764, 765, 770, 771
See application file for complete search history.

(56) References Cited

U.S. PATENT DOCUMENTS

| | | | |
|---|---|---|---|
| 5,441,915 A * | 8/1995 | Lee | 438/631 |
| 6,140,693 A | 10/2000 | Weng et al. | |
| 6,696,720 B1 * | 2/2004 | Sakao | 257/306 |
| 6,717,267 B1 * | 4/2004 | Kunikiyo | 257/758 |
| 2003/0085420 A1 | 5/2003 | Ito et al. | |

FOREIGN PATENT DOCUMENTS

KR  10-20010068729   7/2001

OTHER PUBLICATIONS

English language abstract of Korean Publication No. 10-20010068729.

* cited by examiner

Primary Examiner—David Nhu
(74) Attorney, Agent, or Firm—Marger Johnson & McCollom, P.C.

(57) ABSTRACT

Provided is an invention related to a SOC containing a DRAM and an analog device for increasing a capacitance of a capacitor in SOC and a method of fabricating the SOC. Two conductive layers are used for lower electrode in a capacitor for unit cells of the DRAM, and the whole surface of the upper electrode is capped with a second dielectric layer to maximally increase in the contact surface between the dielectric layer and the upper and lower electrodes.

17 Claims, 3 Drawing Sheets

SYSTEM-ON-CHIP INCLUDING DRAM AND ANALOG DEVICE FOR IMPROVING DRAM CAPACITANCE AND METHOD FOR FABRICATING THE SAME

BACKGROUND OF THE INVENTION

This application claims the priority of Korean Patent Application No. 2003-60766 filed on Sep. 1, 2003, in the Korean Intellectual Property Office, the disclosure of which is incorporated herein in its entirety by reference.

1. Field of Invention

The present invention relates to an integrated semiconductor device and a method of fabricating the same, and more particularly, to a system-on-chip containing a DRAM and an analog device, and a method of fabricating such a system-on-chip.

2. Background of the Invention

Advances in semiconductor manufacturing techniques have lead to a considerable reduction in the size of electronic products. This has made possible the development of products called "systems on chip" (SOC) products. SOCs are chips that perform multiple functions. SOCs have been developed for products in various fields. Moreover, a new SOC containing a DRAM and an analog device has been introduced.

An SOC containing a DRAM and an analog device generally includes a capacitor used as a unit cell for a DRAM. The capacitor should have a surface that is large enough to ensure a high capacitance. However, due to the requirement of high integration, it is necessary to form a capacitor having a high capacitance in a narrow space. Decreasing the size of the capacitor allows a reduction in the size of the analog device, thereby increasing the overall degree of integration.

Several attempts have been made to increase the density of capacitors in SOCs containing a DRAM and an analog device. In general, there are three methods of increasing the capacitance of a semiconductor capacitor based on the fact that, in general, the capacitance of a semiconductor capacitor is directly proportional to the surface of electrode and the dielectric constant of the dielectric layer, and inversely proportional to the thickness of the dielectric layer.

The first method involves increasing the contact surface between the electrode and the dielectric layer of the capacitor. That is, the capacitance is increased by designing an upper electrode and a lower electrode of the capacitor in a three-dimensional configuration. However, this method has a drawback in that making the capacitor in a three-dimensional configuration requires a relatively complicated manufacturing process.

The second method involves making a capacitor with a thin dielectric layer. Since the capacitance is inversely proportional to the thickness of the dielectric layer, the capacitance can be increased by decreasing the thickness of the dielectric layer. However, there is a limit to how much the thickness of the dielectric layer can be decreased owing to the characteristics of the dielectric layer itself.

The third method involves adopting a material with a high dielectric constant for the dielectric layer. However, this method also has many disadvantages. For example it may be difficult to adapt a new dielectric material to an existing process. Furthermore it may require a new electrode material and to it is necessary to verify the reliability of the new electrode material.

SUMMARY OF THE INVENTION

The present invention provides a SOC containing a DRAM and an analog device having a high capacitance capacitor in a DRAM. The present invention also provides a method of fabricating a SOC containing a DRAM and an analog device for increasing the capacitance of the capacitor in the DRAM.

In accordance with an aspect of the present invention, an SOC containing a DRAM and an analog device includes a capacitor which has a lower electrode separated from an upper electrode by a dielectric layer. The upper electrode is patterned containing holes or indentations and it is covered by a second dielectric layer. The second dielectric layer is in turn covered by an upper conductive layer that is connected to the lower electrode. Thus the lower electrode and the upper conductive layer together form the electrode of a high capacitance capacitor.

In accordance with another an aspect of the present invention, the SOC comprises, a substrate, a lower part containing a DRAM and an analog device circuitry formed on the substrate, a first interlayer insulating layer formed on the lower part, a first conductive layer formed on the first interlayer insulating layer performing as a lower electrode of the DRAM, a first dielectric insulating layer formed on the first conductive layer and, a second conductive layer pattern formed on the first dielectric insulating layer. The second conductive layer serves as an upper electrode of the DRAM. The second conductive layer is shielded and covered by the second dielectric insulating layer. The second dielectric layer is covered by a third conductive layer. The upper electrode, second dielectric layer, and the third conductive layer are patterned with holes or indentations to increase the capacitance. The third conductive layer fills and covers the second dielectric layer pattern, and it performs as another electrode of the DRAM. A second interlayer insulating layer covers the surface of the substrate where the third conductive layer is located. A metal pattern for an upper electrode is located on the second interlayer insulating layer and it connects to the upper electrode through a first contact plug. A second metal pattern on the second interlayer insulating layer connects to the lower electrode through a second contact plug.

In accordance with another aspect of the present invention, there is provided a method of fabricating a SOC containing a DRAM and analog device such as that described above.

According to the present invention, the contact surface between the dielectric layer and the upper and lower electrodes can be extended at maximum by using two conductive layers as the lower electrode and by capping the surface of the upper electrode with the second dielectric layer, thereby increasing the density of capacitance of the capacitor for SOC containing a DRAM and analog device.

DETAILED DESCRIPTION OF THE INVENTION

Hereinafter, the present invention will be described more fully with reference to the accompanying drawings. However, this invention may be embodied in many different forms and should not be construed as being limited to the embodiments set forth herein. Rather, theses embodiments are provided so that the disclosure is thorough and complete and fully conveys the concept of the invention to those skilled in the art.

Figure 4:
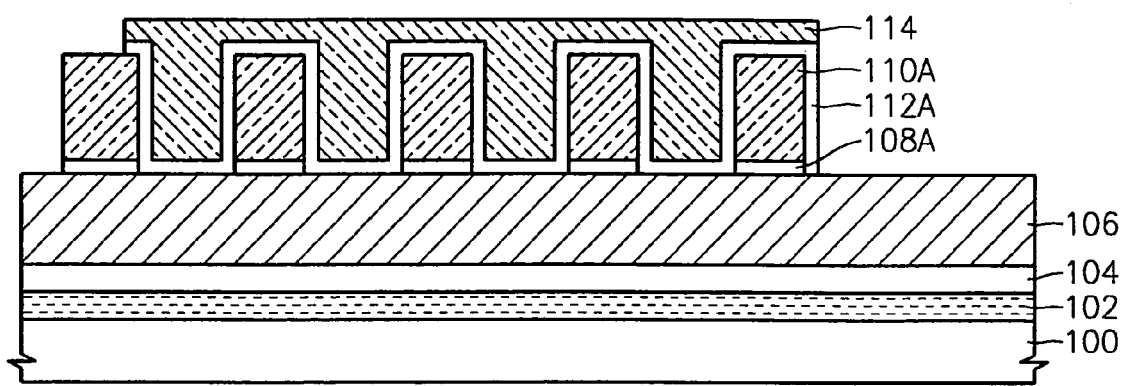
Figure 5:
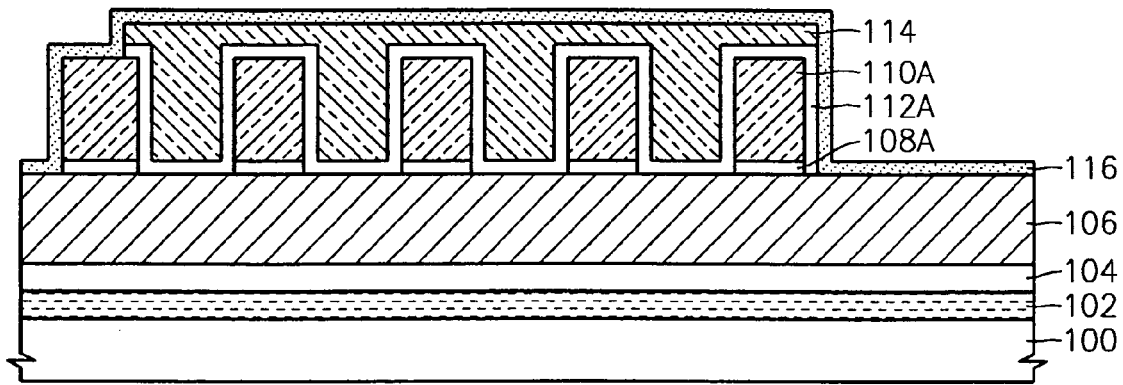
Figure 6:
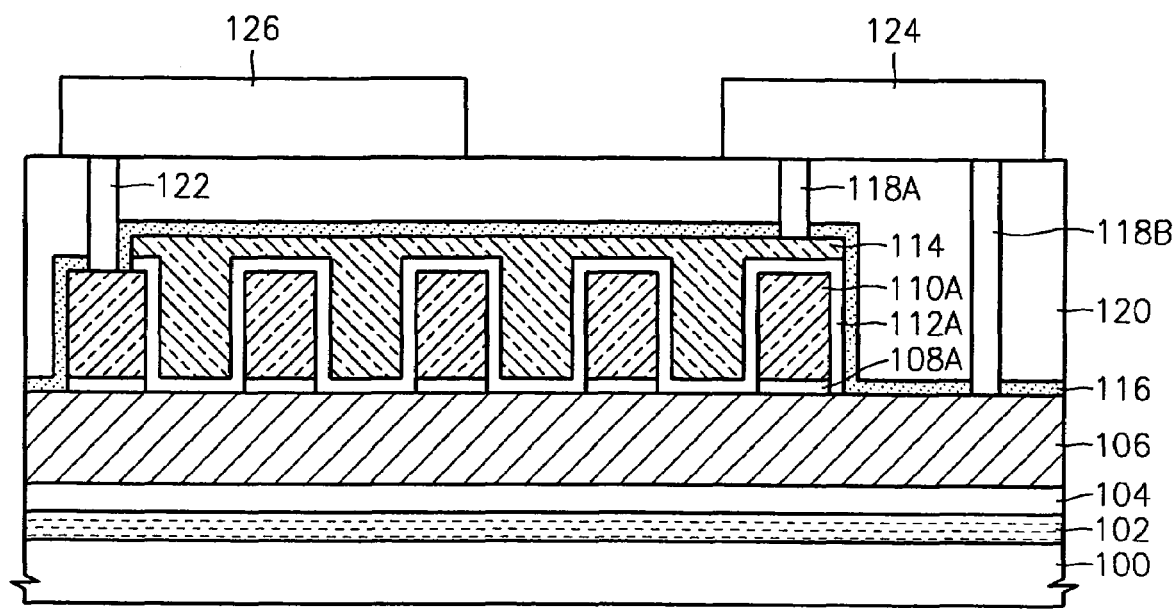

An embodiment of an SOC containing a DRAM and an analog device in accordance with the present invention as it is being farmed is shown in FIGS. 1 to 6. The device at various stages in the manufacture thereof is shown in FIGS. 1 to 5. The completed device is shown in FIG. 6. As shown in FIG. 6, the SOC is formed on a semiconductor substrate 100. The SOC has a lower part 102 that contains a DRAM and an analog device except for the capacitors. The lower part 102 contains conventional circuit that what will be herein referred to as DRAM circuitry.

On top of layer 102 there is first insulating layer 104. A first conductive layer 106 is located on top of insulating layer 104. Later 106 forms a lower electrode for the DRAM.

Figure 7:
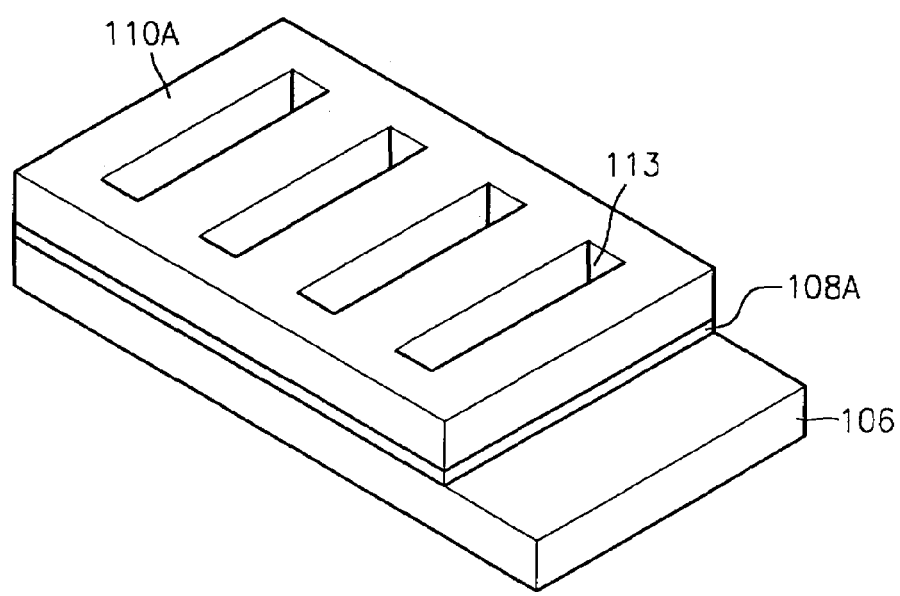
FIG. 7 is a perspective view of a SOC for describing a formation of the second conductive layer pattern for the SOC containing a DRAM and an analog device.

On top of layer 106 there is a dielectric layer 108A. There is a second conductive layer pattern 110A formed on the dielectric layer 108A. Layer 110A is an upper electrode for the DRAM. Layer 110A has a pattern of holes or indentations 113 as shown in FIG. 7. As will be explained1 the holes or indentations are used to increase the capacitance of the capacitor. Layer 110A is shielded or covered by a second dielectric layer 112A. A third conductive layer 114 forms another lower electrode of the DRAM. Layer 114 fills and covers the pattern of holes or indentations in the second conductive layer pattern 110A. An etch stopper layer 116 covers he third conductive layer 114.

The SOC also includes a second insulating layer 120 on the whole surface of the semiconductor substrate on top of the etch stopper layer 116. A metal pattern 126, which forms an upper electrode1 is located on top of the second insulating layer 120. Electrode 126 connects through a first contact plug 122 located in the second insulating layer 120. A metal pattern 124 forms the tower electrode, and electrode 124 connects through contact plugs 118A and 118B located in the second insulating layer 120.

Among the main features of the present invention are first, the use of the two separate conductive layers to form the lower electrodes, i.e., the first conductive layer 106 and the third conductive layer 114. The second is capping of the second conductive layer 110A with a second dielectric layer 112A. Layer 112A forms another dielectric layer of the capacitor and functions with dielectric layer 108A. The surface area of the electrode is increased because the second conductive layer pattern 110A which forms the upper electrode is covered on all surfaces. That is, the upper, lower and side surfaces of layer 110A are in contact with the dielectric layers 108A and layer 112A. Accordingly, the capacitance density can be increased.

Here in after, a method of fabricating a SOC containing a DRAM and an analog device according to the present invention will be described in detail with reference to the accompanying FIGS. 1 and 7.

Figure 1:
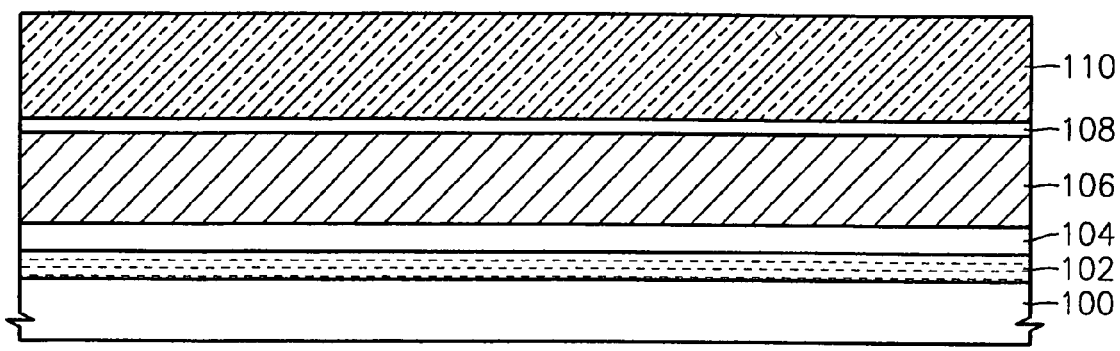
FIGS. 1 through 6 are cross-sectional views of a SOC which will be used to describe a method of fabrication of an SOC containing a DRAM and an analog device in accordance with the present invention.

Referring to FIG. 1, a lower part 102 includes conventional circuitry including in this specific embodiment a DRAM and an analog device (except capacitors). Lower part 102 is formed on a semiconductor substrate 100 in accordance with a conventional method. Layer 102 is hereinafter referred to as DRAM circuitry. Afterward, a first interlayer insulating layer 104 is formed on the lower part 102, and the layer is planarized.

A first conductive layer 106 which will be used as a lower electrode of the DRAM is formed on the first interlayer insulating layer 104. The first conductive layer 106 is formed of a material selected from the group consisting of aluminum, polysilicon doped with impurities, and silicide. Also, the first conductive layer 106 can further include titanium nitride as a barrier layer to avoid the interface reaction with a dielectric layer 108 which will be formed in following process. The first conductive layer 106 is preferably connected to the lower part 102 through a contact plug, not shown in the drawing.

Next, a first dielectric insulating layer 108 is formed, as thin as possible, on the first conductive layer 106. The first dielectric layer 108 can be formed of a single layer selected from the group consisting of silicon oxide ($SiO_2$), silicon nitride (SiN), oxide silicon nitride (SiON), aluminum oxide (AiO), and tantalum oxide (TaO), or a composite layer containing at least one of the above insulating layers. That is, the material of the first dielectric layer 108 can be a material which can be formed in a thin layer, and which has a high dielectric constant.

Next, a second conductive layer 110 which will perform as an upper electrode of the DRAM is formed on the dielectric insulating layer 108. The second conductive layer can be formed of a layer selected from the group consisting of aluminum, polysilicon doped with impurities, and silicide. Also, the second conductive layer 110 can further include titanium nitride (TiN) as a barrier layer to avoid the interface reaction with the dielectric layer 108. Increasing the thicker the second conductive layer 110 increases the capacitance.

Figure 2:
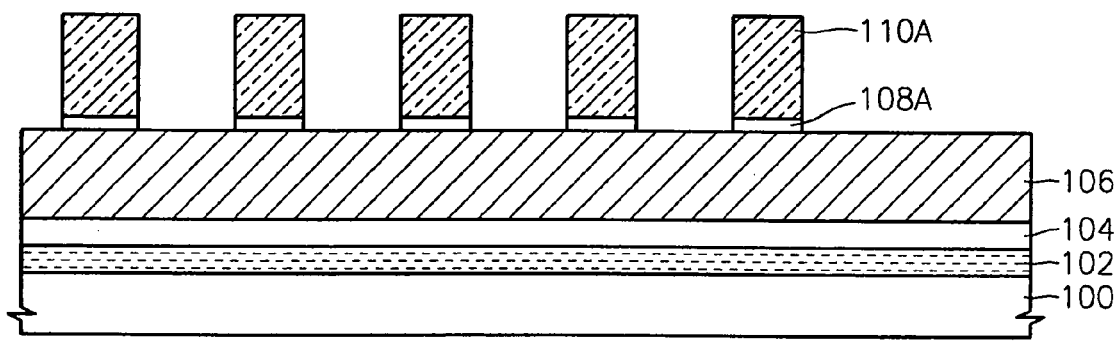

As shown in FIG. 2, layers 108 and 110 are patterned. After depositing a photo-resist (not shown) on the whole surface of the second conductive layer 110, a conductive layer pattern 110A and a dielectric layer pattern 108A are formed by a conventional method of photolithographic and etching processes.

Figure 3:
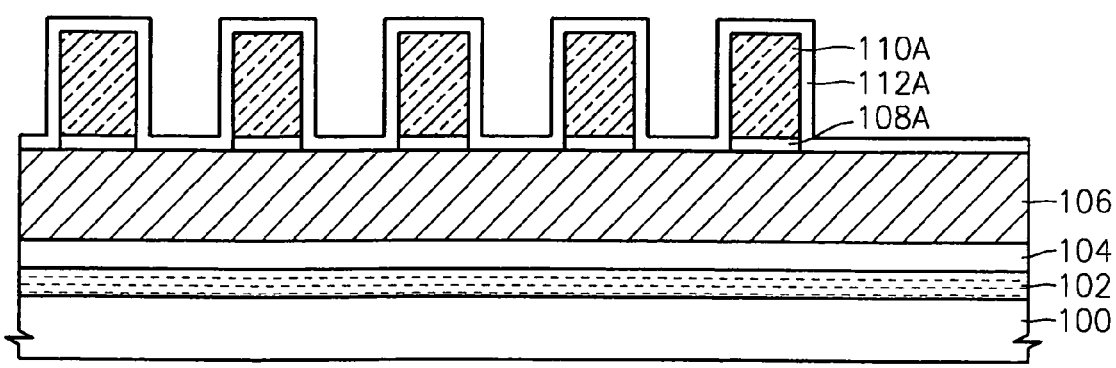

Referring to FIG. 3, a second dielectric insulating layer 112A in a uniform thickness is formed on the resultant structure. Accordingly, layer pattern 110 is capped with the second dielectric layer 112. The result is a pattern that increases the capacitance.

The configuration of the second conductive layer pattern 110 and the pattern unit 113 (FIG. 7, 113) will be described referring to the FIG. 7. The configuration of the pattern unit (FIG. 7, 113) can be formed in any shape as long as it can increase the surface area of the second conductive layer pattern 110. Preferably, the shape can be a square, a rectangle, a circle, or a composite shape of these shapes. That is, in the present invention, the surface of the pattern unit (FIG. 7, 113) can be increased by forming it in a square shape as depicted in the drawing, thereby increasing the capacitance as much as the surface of the square.

The second dielectric layer 112 forms another dielectric layer of the capacitor in the DRAM together with the first insulating layer pattern 108A. The second dielectric insulating layer 112 also can be formed of a single layer selected from the group consisting of silicon oxide ($SiO_2$), silicon nitride (SiN), oxide silicon nitride (SiON), aluminum oxide (AiO), and tantalum oxide (TaO), or a composite layer containing at least one of the above insulating layers. Also, for the improvement of the capacitance of a capacitor as the object of the present invention, the material of the second dielectric layer 112 can be replaced by a material which can be formed in a thin layer, and has a high dielectric constant.

Referring to FIG. 4, a third conductive layer 114, which will perform as another lower electrode of the DRAM, is formed on the entire of the substrate where the second dielectric layer 112A is located. It is necessary to pattern the third conductive layer 114 to expose a portion of the second conductive layer pattern 110A to the outside. This is, to form a contact between the conductive layer pattern 110A and the metal pattern 126. The third conductive layer 114 can be formed of the same material as the first and the second conductive layers 106 and 110.

Referring to FIG. 5, an etch stopper layer 116 is formed on the entire surface of the substrate where the third conductive layer 114 is formed. The etch stopper layer has an etch selectivity with the second interlayer insulating layer 120 and it can be formed of a layer selected from the group consisting of silicon nitride, oxidized silicon nitride, and silicon oxide. The reason for forming the etch stopper layer 116 is to avoid problems of over etching or incomplete through hole of the contact holes for forming the first and second contact plugs 122, 118A, and 118B when forming metal patterns for an upper electrode 126 in FIG. 6 and a lower electrode 124.

Referring to FIG. 6, a second interlayer insulating layer 120 is formed on the substrate where the etch stopper layer 116 is formed. The second interlayer insulating layer 120 is formed for reducing step coverage when forming the capacitor. It can be formed of a single layer or a composite layer of silicon oxide. Next, the contact holes for electrical connection of metal patterns for upper and lower electrodes are formed through the second interlayer insulating layer 120 by photolithographic and etching processes. Then the first contact plug 122 and the second contact plugs 118A and 118B are formed by filling the contact holes with a conductive material such as tungsten or aluminum. One of the second contact plugs 118A is connected to the third conductive layer 114 and the other is connected to the first conductive layer 106.

Next, the metal pattern 126 for upper electrode, connecting to the first contact plug 122, and the metal pattern 124 for lower electrode connecting to the second contact plugs 118A and 118B are formed of a conductive material like aluminum. The process for forming the metal pattern 126 for upper electrode and the metal pattern 124 for lower electrode in the second interlayer insulating layer 120 can be conducted by the so called damascene process using copper instead of aluminum.

For a capacitor according to the present invention, the contact surface between the dielectric layers and the upper and lower electrodes can be extended at maximum by using two conductive layers as the lower electrode and by capping the surface of the upper electrode with the second dielectric layer. Accordingly, the capacitance density of a capacitor for SOC containing a DRAM and analog device can be increased.

It is noted that the capacitors formed in layers 104 to 114 are connected to the conventional circuitry in layer 102 by conventional connections (not specifically shown in the drawings) as needed.

Also, in accordance with an embodiment of the present invention, the second interlayer insulating layer can comprise an etch stopper layer there under, and the etch stopper layer is a layer having an etch made of a material selectivity with the second interlayer insulating layer, and preferably can be formed of a layer selected from the group consisting of silicon nitride, oxidized silicon nitride, and silicon oxide.

In accordance with an aspect of the present invention, there is provided a method of fabricating a SOC containing a DRAM and analog device comprising forming a lower part on a semiconductor substrate including the DRAM and an analog device, sequentially depositing a first interlayer insulating layer, a first conductive layer performing as a lower electrode of the DRAM, and a first insulating layer performing as a dielectric layer of the DRAM on the lower part, forming a second conductive layer performing as an upper electrode of the DRAM on the first insulating layer, forming a second conductive layer pattern by patterning the second conductive layer and the first insulating layer, forming a second insulating layer on the whole surface of the substrate after patterning the second conductive pattern, forming and patterning a third conductive layer performing as another lower electrode of the DRAM on the semiconductor substrate where the second insulating layer is formed, forming a second interlayer insulating layer for covering step of the semiconductor substrate where the third conductive layer is patterned, forming a metal pattern for upper electrode connecting to the second conductive layer pattern and a meal pattern for lower electrode connecting to the first and the third conductive layer on the second interlayer insulating layer.

According to the preferred embodiment of the present invention, a method of fabricating the SOC containing a DRAM and analog device further comprises forming an etch stopper layer after forming and patterning the third conductive layer pattern.

Preferably, the third conductive layer is patterned to expose a portion of the second conductive layer pattern to the outside. According to a preferred embodiment of the present invention, the first and second insulating layers preferably can be formed of a single layer made of a metal selected from the group consisting of silicon oxide (SiO), silicon nitride (SiN), oxidized silicon nitride (SiON), aluminum oxide (AlO), and tantalum oxide (TaO), or a composite layer including at least one of the above insulating layers, and the first through the third conductive layers preferably can be formed of a conductive layer selected from the group consisting of aluminum, polysilicon, and silicide.

The first through the third conductive layers can further comprise a barrier layer like titanium nitride (TiN).

The pattern unit of the second conductive layer pattern can be square, rectangle, circle, or a combination of these for increasing the contact surface between the second and third conductive layers and the second dielectric layer. The term hole as used herein means hole or indentation.

While this invention has been particularly shown and described with reference to a preferred embodiment thereof, it will be understood by those skilled in the art that various changes in form and details may be made therein without departing from the sprit and scope of the invention as defined by the appended claims.

What is claimed is:

1. A system on chip (SOC) containing a DRAM and an analog device, comprising:
   a substrate;
   a lower part on the substrate containing circuitry;
   a first interlayer insulating layer on top of the lower part;
   a first conductive layer on the first interlayer insulating layer, the first conductive layer forming a lower electrode for the DRAM,
   a first dielectric layer formed on the first conductive layer;
   a second conductive layer on the first dielectric layer and forming an upper electrode of the DRAM, the second conductive layer having holes therein;

a second dielectric layer covering the second conductive layer;

a third conductive layer covering the second dielectric layer, and performing as another lower electrode of the DRAM, the third conductive layer filling the holes of the second conductive layer;

a second interlayer insulating layer covering third conductive layer;

a first metal pattern formed on the second interlayer insulating layer connecting to the upper electrode through a first contact plug which is formed in the second interlayer insulating layer; and a second metal pattern formed on the second interlayer insulating layer connecting to the lower electrode through a second contact plug.

2. The SOC of claim 1, wherein the first and the second dielectric layers are formed of a material chosen from silicon oxide ($SiO_2$), silicon nitride (SiN), oxide silicon nitride (SiON), aluminum oxide AlO, and tantalum oxide (TaO).

3. The SOC of claim 1, wherein the first and the second dielectric layers comprise a composite layer formed of a material chosen from silicon oxide ($SiO_2$), silicon nitride (SiN), oxide silicon nitride (SiON), aluminum oxide (AlO), and tantalum oxide (TaO).

4. The SOC of claim 1, wherein the first, the second, and the third conductive layers are formed of a material chosen from aluminum, palysilicon, and silicide.

5. The SOC of claim 4, wherein the first, the second, and the third conductive layers further comprise a barrier layer.

6. The SOC of claim 5, wherein the barrier layer comprises titanium nitride (TiN).

7. The SOC of claim 1, wherein the second conductive layer is shaped to increase a contact surface between the second and the third conductive layers and the second dielectric layer.

8. The SOC of claim 7, wherein a shape for increasing the contact surface between the second and the third conductive layers and the second dielectric layer is a square, a rectangvlar, a circle, or a composite shape of these shapes.

9. The SOC of claim 1, wherein the first contact plug is formed for electrically connecting the second conductive layer patters to the first metal pattern.

10. The SOC of claim 1, wherein the second contact plug is formed for electrically connecting the first and third conductive layers to the second metal pattern.

11. The SOC of claim 1, wherein the second interlayer insulating layer further comprises an etch stopper layer thereunder.

12. The SOC of claim 1, wherein the second interlayer insulating layer is formed of a layer selected from the group consisting of a single layer or and a composite layer of silicon oxide.

13. The SOC of claim 11, wherein the etch stopper layer is a layer having an etch selectivity with respect to the second interlayer insulating layer.

14. The SOC of claim 13, wherein the etch stopper layer is formed of a layer selected from a group consisting of silicon nitride, oxidized silicon nitride, and silicon oxide.

15. A capacitor for a DRAM comprising:

a first conductive layer forming a lower electrode for the DRAM;

a first dielectric layer formed on the first conductive layer;

a second conductive layer on the first dielectric layer and forming an upper electrode of the DRAM, the second conductive layer having a pattern with holes therein, the holes having an inner surface;

a second dielectric layer covering the second conductive layer including the inner surface of the holes, thereby forming partially filled holes;

a third conductive layer covering the second dielectric layer, filling the partially filled holes, and forming another lower electrode of the DRAM; and a connection between the first and the third conductive layers.

16. The capacitor of claim 15, wherein the first conductive layer is a substantially flat layer.

17. The capacitor of claim 15, wherein the third conductive layer is in contact with the second dielectric layer.

* * * * *

UNITED STATES PATENT AND TRADEMARK OFFICE
CERTIFICATE OF CORRECTION

| | |
|---|---|
| PATENT NO. | : 7,075,136 B2 |
| APPLICATION NO. | : 10/922439 |
| DATED | : July 11, 2006 |
| INVENTOR(S) | : Dong-Ryul Chang |

Page 1 of 1

It is certified that error appears in the above-identified patent and that said Letters Patent is hereby corrected as shown below:

Column 3, line 14, the word "farmed" should read -- formed --;
Column 3, line 20, the word "circuit" should read -- circuitry --;
Column 3, line 29, the word "explained1" should read -- explained --;
Column 3, line 40, the word "electrode1" should read -- electrode --;
Column 7, line 7, the word "third" should read -- the third --;
Column 7, line 27, the word "palysilicon" should read -- polysilicon --;
Column 7, lines 38-39, the word "rectangvlar" should read -- rectangular --;
Column 7, line 42, the words "layer patters" should read -- layer --;
Column 8, line 10, the words "layer or" should read -- layer --.

Signed and Sealed this

Twenty-eighth Day of July, 2009

JOHN DOLL
*Acting Director of the United States Patent and Trademark Office*